US 8,860,401 B2

(12) United States Patent
Prance et al.

(10) Patent No.: US 8,860,401 B2
(45) Date of Patent: Oct. 14, 2014

(54) SENSOR SYSTEM AND METHOD

(75) Inventors: Robert Prance, Brighton (GB); Helen Prance, Brighton (GB); Christopher Harland, Brighton (GB)

(73) Assignee: University of Sussex (GB)

( * ) Notice: Subject to any disclaimer, the term of this patent is extended or adjusted under 35 U.S.C. 154(b) by 854 days.

(21) Appl. No.: 12/669,615

(22) PCT Filed: Jul. 15, 2008

(86) PCT No.: PCT/GB2008/002408
§ 371 (c)(1),
(2), (4) Date: Jun. 29, 2010

(87) PCT Pub. No.: WO2009/010735
PCT Pub. Date: Jan. 22, 2009

(65) Prior Publication Data
US 2010/0289479 A1    Nov. 18, 2010

(30) Foreign Application Priority Data

Jul. 19, 2007 (GB) .................................. 0714090.8

(51) Int. Cl.
*G01R 23/02* (2006.01)
*H03H 11/12* (2006.01)
(52) U.S. Cl.
CPC ....... *H03H 11/1217* (2013.01); *H03H 11/1291* (2013.01)
USPC ......... 324/76.39; 327/553; 330/109; 330/294
(58) Field of Classification Search
USPC ........... 324/551–559; 330/109, 282, 293, 294
See application file for complete search history.

(56) References Cited

U.S. PATENT DOCUMENTS

| 3,602,833 | A |   | 8/1971  | Barnette              |
|-----------|---|---|---------|-----------------------|
| 3,643,173 | A | * | 2/1972  | Whitten ........ 330/253 |
| 3,986,127 | A |   | 10/1976 | Ray                   |
| 4,078,215 | A |   | 3/1978  | Vinson                |
| 4,417,214 | A |   | 11/1983 | Sevastopoulos et al.  |

(Continued)

FOREIGN PATENT DOCUMENTS

| GB | 1160567     |    | 8/1969 |
|----|-------------|----|--------|
| WO | 03048789    | A2 | 6/2003 |

OTHER PUBLICATIONS

Band-stop filters, available at http://web.archive.org/web/20061206064924/http://www.allaboutcircuits.com/vol_2/chpt_8/5.html on Dec. 6, 2006.*

(Continued)

*Primary Examiner* — Melissa Koval
*Assistant Examiner* — Daniel Miller
(74) *Attorney, Agent, or Firm* — Brooks Kushman PC

(57) ABSTRACT

The present invention provides a sensor system and a corresponding sensing method employing the sensor system. The sensor system comprises a sensor (12) having an input (20) and an output (22), a feedback path (16) from the output to the input, and a filter (14; 92) in the feedback path. The filter comprises a narrow band filter, which is tuned or tunable to a respective one of signals that are wanted signals and signals that represent interference signals. The sensor and the filter are arranged so as to alter the relative amplitudes of the wanted signals and the interference signals in order to increase the relative amplitude of the wanted signals and reduce the relative amplitude of the interference signals.

18 Claims, 7 Drawing Sheets

(56) References Cited

U.S. PATENT DOCUMENTS

| | | | |
|---|---|---|---|
| 4,984,292 A | 1/1991 | Millen | |
| 5,296,763 A | 3/1994 | Tanigawa et al. | |
| 5,994,952 A | 11/1999 | Thornton | |
| 7,088,175 B2 * | 8/2006 | Krupka | 330/69 |
| 2004/0164796 A1 | 8/2004 | Nakamura et al. | |
| 2005/0162219 A1 | 7/2005 | Adan | |
| 2005/0253647 A1 | 11/2005 | Hagari | |
| 2006/0058694 A1 | 3/2006 | Clark et al. | |

OTHER PUBLICATIONS

Harland et al. "High Resolution Ambulatory Electrocardiographic Monitoring Using Wrist-Mounted Electric Potential Sensors", Institute of Physics Publishing, Measurement Science and Technology 2003, vol. 14, p. 923-928.

Prance et al. "Adaptive Electric Potential Sensors for Smart Signal Acquisition and Processing", Sensors and Their Applications, Journal of Physics: Conference Series 2007, vol. 76, 6 Pages.

Prance et al. "Compact Broadband Gradiometric Induction Magnetometer System", Sensors and Actuators 1999, vol. 76, p. 117-121.

Prance et al. "Compact Room-Temperature Induction Magnetometer with Superconducting Quantum Interference Device Level Field Sensitivity", Review of Scientific Instruments 2003, vol. 74, No. 8, p. 3735-3739.

Prance et al. "Hardware Comb Filter Enhances Dynamic Range and Noise Performance of Sensors in Noisy Environments", Review of Scientific Instruments 2007, vol. 78, 6 Pages.

Search Report for GB 0714090.8, Date of Search Oct. 29, 2007, 2 Pages.

International Search Report for PCT/GB2008/002408, Dated Nov. 20, 2008, 3 Pages.

* cited by examiner

SENSOR SYSTEM AND METHOD

FIELD OF THE INVENTION

The present invention concerns a sensor system for use for the sensitive measurement and detection of signals in a wide variety of applications, and a corresponding sensing method.

BACKGROUND OF THE INVENTION

Various problems associated with the use of extremely sensitive sensors are well known. One principal problem encountered is that of dynamic range. A very high sensitivity detector will, of necessity, be required both to accommodate extremely small detected signals and at the same time avoid saturation in the presence of large amplitude interference signals. This introduces a conflict with the need for high gain in order to amplify small signals and lift them above the noise floor of subsequent stages, such as in analogue to digital (A/D) converters, since such gain cannot be so large that it leads to saturation from large interference signals.

The principal interference signals are usually caused by mains related frequencies. These are normally well defined in frequency, but may vary both in amplitude and in spectral composition of the various harmonics of 50 Hz (or 60 Hz). This situation has been exacerbated by the now widespread use of switch mode power supplies in almost all electronic appliances. In many cases these power supplies create more high order harmonics, of significantly larger amplitude, than their equivalent linear circuits. There are a number of approaches which may be used to alleviate the problem of large 50 Hz (or 60 Hz) and harmonically related interference signals.

In the case of magnetometers, a common solution is to use two or more sensors arranged in a gradiometric configuration to attenuate the effect of distant sources. This, however, produces a system which is sensitive to field gradients instead of fields, thus rendering it unsuitable for applications where the source is remote from the sensor.

Another solution, in the case of magnetometers, is to filter out the frequency components corresponding to the interference signals, either by means of analogue filters or by employing digital filtering techniques after the signal has been digitised. A problem with the latter approach, however, is that digitising the signal may produce a large dynamic range between the wanted signal and the interference signal. The ratio may easily reach $1:3\times10^7$ or 150 dB in an open unshielded environment. As a result, the subsequent stage, for example an A/D converter, would require at least 24 bit accuracy and a sub-microvolt noise floor. A much simpler and more robust solution is to implement analogue filtration in hardware. This attenuates the amplitude of the interfering signals considerably and thereby reduces the requirement for such a large dynamic range and low noise floor in the subsequent stage or A/D converter. For example, an attenuation of 60 dB in an interference signal would reduce the dynamic range requirement to 90 dB, a level which may easily be handled by a 16 bit A/D system.

As an illustration of the magnitude of the problem, a top of the range 24 bit A/D converter is stated as having only 110 dB of dynamic range with 45 kHz of bandwidth. This A/D converter is seven times more expensive than a typical 16 bit A/D converter which will display >90 dB of dynamic range and >100 kHz of bandwidth. Clearly, the 24 bit converter is not only a very expensive option, but it also fails to meet the above requirement for a 150 dB dynamic range.

Although the problems relating to the use of extremely sensitive sensors are described above in relation to magnetometers, nevertheless the competing requirements of low noise and high dynamic range are common to many sensor systems, including electrical potential sensors as well.

It is worth noting that in almost all real world applications of sensors, the sensor sensitivity is limited not by the inherent capability of the sensor or the instrumental noise but by the ability of the system to encompass the full dynamic range of environmental noise and interference.

There is, therefore, a very significant need for a highly sensitive sensor, in which the problems of interference are satisfactorily addressed.

SUMMARY OF THE INVENTION

The present invention seeks to address and provide a solution to the above problems.

Especially, the present invention seeks to address the problems associated with the signal processing of data where the signal to noise ratio is very low (typically less than unity), in particular where the amplitude of the noise or interference is significantly larger than the wanted signal.

Another aim of the invention, at least in its preferred form as described in this document, is to reduce the dynamic range requirement of a sensor by reducing the amplitude of large interference signals.

The present invention, at least in the preferred form as described, also seeks to render the operation of the sensor and the signal processing more precise by one or both of increasing the sensitivity to the correct combination of frequencies and reducing it at all others.

A further aim of the invention is to provide an improved sensor arrangement, which is applicable to a wide variety of electronically based sensor systems where signal to noise ratio is important.

According to the present invention, there is provided a sensor arrangement comprising: a detection element; a sensor for detecting signals received from the detection element and for producing a measurement signal as output, the sensor having an input and an output, the detection element being connected to the input; a feedback path from the output to the input, the feedback path including a narrow band filter; and means for controlling the frequency response of the filter, whereby to tune the frequency response respectively to detection signals that are wanted signals and/or to signals that represent interference signals; wherein the sensor and the filter are arranged to co-operate so as to alter the relative amplitudes of the wanted signals and the interference signals in order to increase the relative amplitude of the wanted signals and reduce the relative amplitude of the interference signals.

According to another aspect of the invention, there is provided a method of sensing and measuring electrical signals, comprising: detecting the electrical signals; applying the detected signals to an input of a sensor for generating a measurement signal as output; providing a feedback path from an output of the sensor to the input; situating a narrow band filter in the feedback path; controlling the frequency response of the filter whereby to tune the frequency response to a respective one of signals that are wanted signals and signals that represent interference signals; and arranging the sensor and the filter so as to alter the relative amplitudes of the wanted signals and the interference signals in order to increase the relative amplitude of the wanted signals and reduce the relative amplitude of the interference signals.

According to the invention, the sensor and the signal processing are tailored by increasing the sensor sensitivity to the correct combination of frequencies and reducing it at all others. One result of employing such a technique is to reduce the dynamic range requirement of the sensor.

Such reduction may be achieved by increasing the amplitude of the wanted signals and/or by reducing the amplitude of the interference signals. The frequency response of the sensor may thus be controlled according to the desired application. In addition, the selectivity of the sensor may be controlled if desired by adjusting or varying the Q factor of the filter. A very precise tuned response to the particular signalling environment may therefore be achieved, which has significant advantages.

The invention may employ at least one band-pass or band-stop filter for altering the relative amplitudes of the wanted and the interference signals, and various embodiments of feedback filter arrangement including one or a parallel arrangement of band-pass filters or including one or a series of band-stop filters are described.

The techniques according to the invention are applicable to a range of electronically based sensor systems where signal to noise ratio is important, and in particular may be applied both to electric potential sensors and to induction magnetometers.

BRIEF DESCRIPTION OF THE DRAWINGS

The invention is described further by way of example only with reference to the accompanying drawings, in which.

DETAILED DESCRIPTION OF PREFERRED EMBODIMENTS

Figure 1:
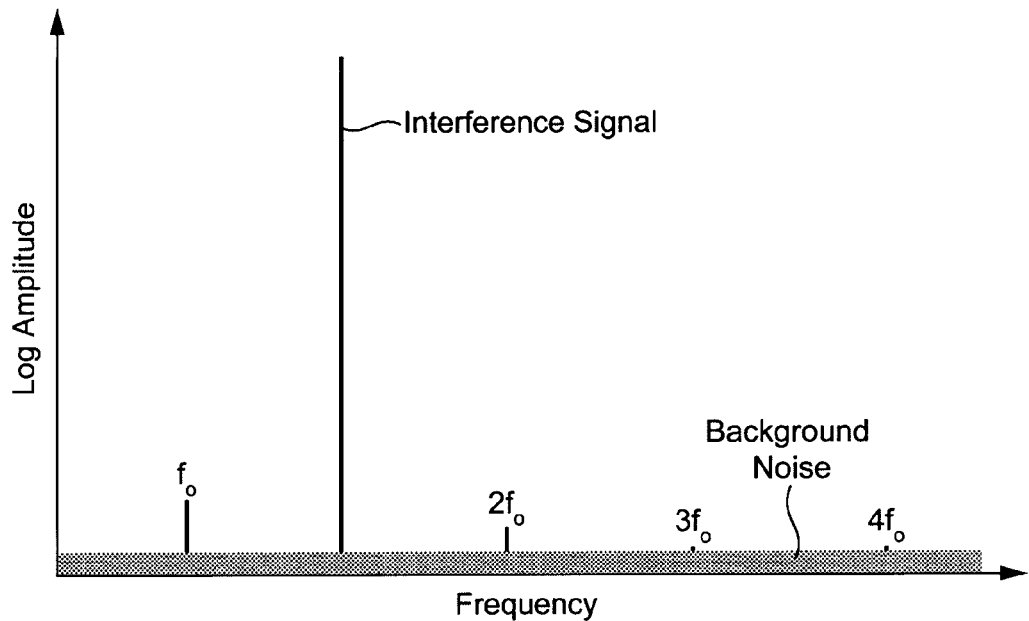
FIG. 1 is a signal diagram showing frequency against amplitude for both wanted and interference signals in the prior art.
Figure 2:
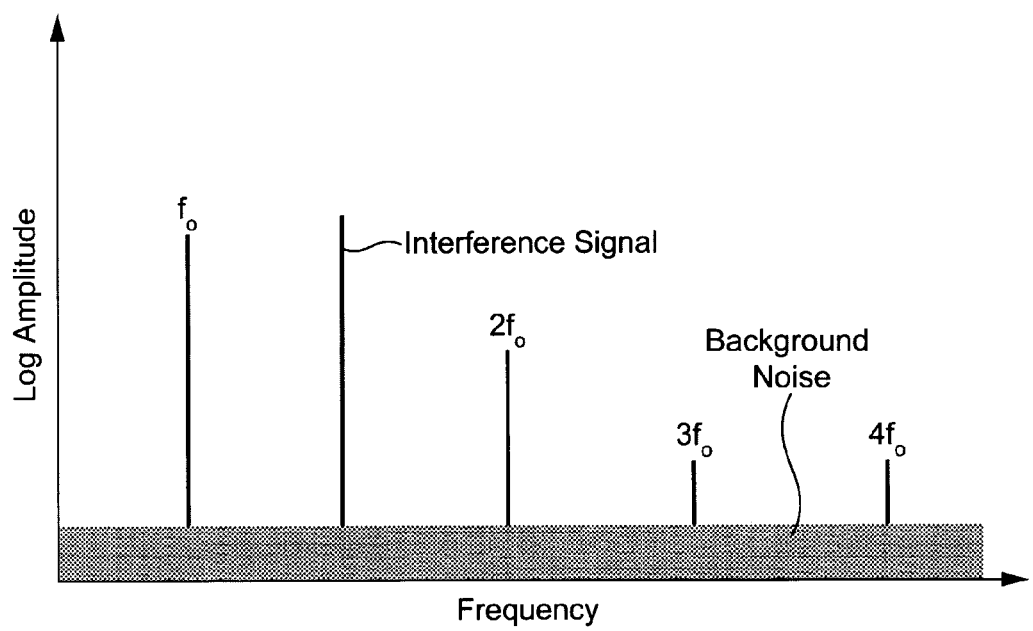
FIG. 2 is a signal diagram showing frequency against amplitude for both wanted and interference signals according to the invention.

The invention will now be described with reference to the drawings. Reference is made firstly to FIGS. 1 and 2 for an explanation of the principles of the invention. These Figures are comparative signal diagrams showing frequency against a logarithmic value for amplitude for the various signals encountered by a sensor in practice, including wanted or detection signals and unwanted or interference signals.

FIG. 1 shows a typical situation where a large interference signal is present amongst the signals received by a conventional sensor. In order to prevent saturation or clipping of the sensor, which would result in dead sensing regions and loss of the wanted signals (fo, 2fo, 3fo and 4fo), the gain of the sensor has hitherto been restricted to a value which keeps the interference signal within the dynamic range of the system, and this introduces the problems referred to above.

By comparison, in the example of FIG. 2, the frequency response of the sensor has been tailored according to the invention to increase the relative amplitude of the wanted signals and reduce the relative amplitude of the interference signal, thereby increasing the effective dynamic range of the sensor.

In some embodiments of the invention, this is achieved by attenuation of the interference signal (using one or a combination of the tuned filter techniques described below) allowing additional gain to be used in the sensor. This results in larger amplitudes for the wanted signals and an improvement in the signal to noise ratio with respect to the background (instrumental) noise. Alternatively, the wanted signals may be selected using a combination of tuned filters in the feedback network of the sensor to tailor the response to these particular waveforms and so reject all other noise.

Figure 3:
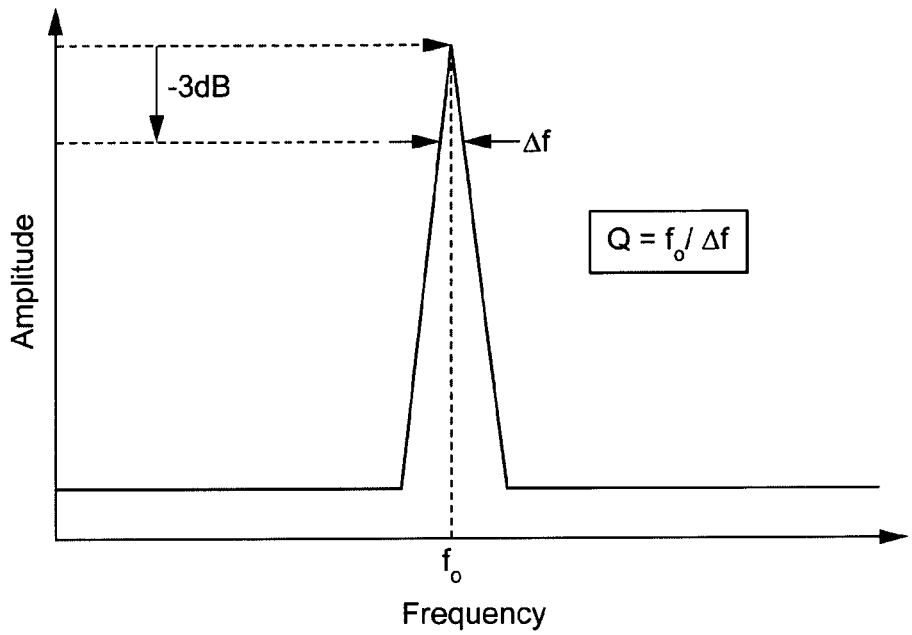
FIG. 3 is a graph illustrating the quality or Q factor of a filter.

In a further development of the invention, not only is the frequency response of the sensor tailored to at least one of the wanted signals and the interference signals, but also the selectivity of the sensor is adjusted by controlling its sensitivity to signal bandwidth. This may be achieved, as described below, by varying the Q factor of at least one filter of the sensor, the Q factor describing both the ability of the filter to produce a large output at its resonant frequency and the frequency selectivity of the filter. The definition of the quality or Q factor of a filter is: the ratio of the filter centre frequency to the signal bandwidth, the signal bandwidth being defined as the width of the resonance at the points where the signal amplitude has reduced to 3 dB less than the peak value at the centre frequency. FIG. 3 is a signal diagram to illustrate the Q factor, which is given by the equation:

$$Q = \frac{f_0}{\Delta f}$$

Hence, by adjusting the Q factor, the sensor may be tailored closely not only to the signal peak frequency but also to the signal bandwidth.

Examples will now be given of various embodiments, implemented respectively in an electric potential sensor and an induction magnetometer, to illustrate the generic capability of the technique.

Figure 4:
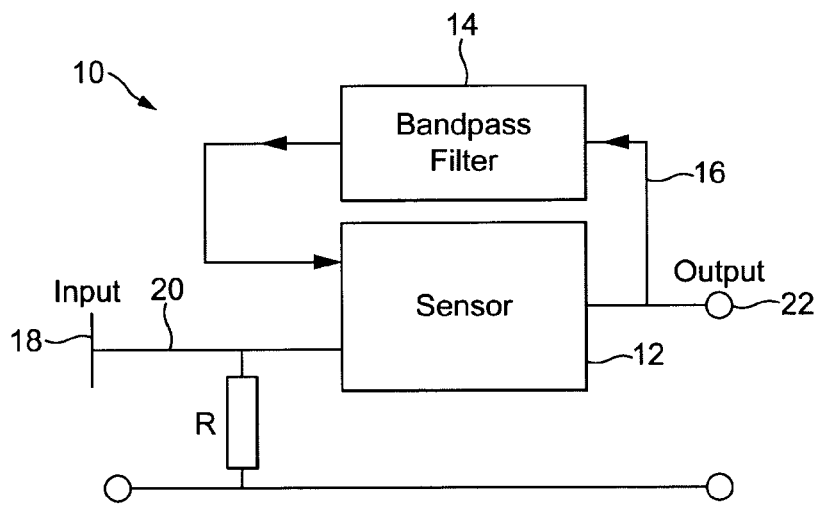
FIG. 4 is a basic block diagram of a first embodiment of sensor system having a feedback arrangement according to the invention.

A first general embodiment according to the invention is shown in FIG. 4, according to which a sensor system 10 comprises an operational amplifier as sensor 12 having an input electrode 18 connected to an input 20, and an output 22. A tunable filter 14 is incorporated in a feedback network 16 of the sensor 12, which filter 14 is arranged to be tailored to the frequency response of the sensor system 10 in very particular ways. The filter 14 in this instance is a narrow band, tuned, band-pass filter, and the feedback network 16 is a negative feedback loop. By tuning the filter to the interference frequency, maximum feedback may be obtained at the interference signal frequency and therefore minimum gain, i.e. the sensor 12 has a band-stop or notch filter characteristic. As a result of placing the filter 14 in a negative feedback loop, the feedback attainable is not limited by the gain of the sensor, and as large a feedback signal as is desired may be fed back in order to suppress the interference signal. This results in the effective dynamic range of the sensor 12 being increased by a substantial factor, since the reduced amplitude interference signal no longer causes saturation.

Such a technique is likely to be of use in applications where measurements are to be made in a noisy unshielded environment, for example the acquisition of physiological signals using non-contact electric potential sensors in an open noisy environment.

Figure 5:
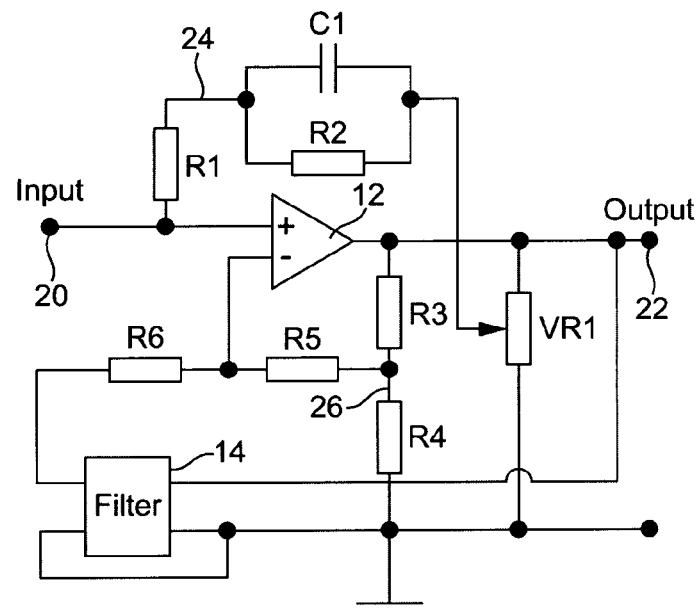
FIG. 5 is a circuit diagram of an electric potential sensor according to the first embodiment.

FIG. 5 shows a specific example of the sensor arrangement of FIG. 4 applied to an electric potential sensor. In this example, the sensor 12 receives an input signal from the input 20 and provides an output signal at the output 22. Bootstrapping is provided by a feedback arrangement 24 including a bias resistor R1 and a parallel connection of a resistor R2 and a capacitor C1. A potentiometer VR1 sets the level of the bootstrap provided to the input bias resistor R1 through the capacitor C1. The resistor R2 provides a path for the DC bias current to flow through. Two resistors R3 and R4 in series at the output of the sensor 12 form a potential divider 26, which determines the voltage gain of the sensor 12. Two further resistors R5 and R6 are connected between the potential divider 26, the filter 14 and the inverting input of the sensor 12 so as to sum the feedback signals from the potential divider 26 and the filter 14. This technique will also allow the sensor gain to be increased without saturation, thereby increasing the signal to noise ratio.

The electric potential sensor of FIG. 5 comprises a high impedance electrometer of the kind described in our earlier published International Patent Application No. WO 03/048789, in which techniques such a bootstrapping are employed in order to provide a high input impedance and thereby reduce the power of the input signal required to operate the sensor. By means of these techniques, the input electrode 18 is enabled to detect small electrical potential signals originating from an object under test for generating accurate detection or measurement signals in situations where only very weak electric potentials may be present. In the present instance, only the example of bootstrapping is described. However, in practice, as described in our earlier case, a combination of ancillary circuits may be included in the electrometer cumulatively to increase the sensitivity of said electrometer to said small electrical potentials whilst not perturbing the electrical field associated therewith. Such ancillary circuits may include not only a feedback arrangement providing bootstrapping but instead, or in addition, a guard circuit for the input electrode and/or a feedback arrangement providing at least one of neutralisation, supply rail drift correction, supply modulation and offset correction for said sensor. Accordingly, the disclosure of WO 03/048789 is incorporated herein by reference, including details of all such ancillary circuits.

The feedback network of the present invention, comprising the negative feedback loop including the filter 14, may be employed in conjunction with any or all of the above techniques and ancillary circuits for enhancing the sensitivity of the electric potential sensor 12.

The simplest implementation for the band-pass filter 14 of FIGS. 4 and 5 is to use a band-pass filter that is tuned to the fundamental frequency of the mains electricity supply (50 Hz or 60 Hz). Such a tunable filter arrangement is shown in FIG. 6.

As shown, the filter 14 in this instance comprises three filter stages 30, 32, 34, each including an amplifier 36 and feedback arrangement 38. The second and third stages 32, 34 are identical all-pass filter networks, an all-pass filter being one which modifies the phase of a signal in a frequency dependent manner in a predetermined way (in contrast with the more familiar filters, such as low- or high-pass filters, which modify the amplitude of a signal in a predetermined way). All-pass filters are often used to correct for the phase shifts introduced by conventional filters, a correct combination of a conventional filter and an all-pass filter producing an output signal which has a delay that is independent of frequency. This is particularly important where pulse signals are concerned, since if this condition is not satisfied dispersion of the pulse will occur. In the present instance, two all-pass filters are employed in order to ensure that to sufficient phase change occurs at the chosen frequency to allow the band-pass function to be implemented.

Figure 6:
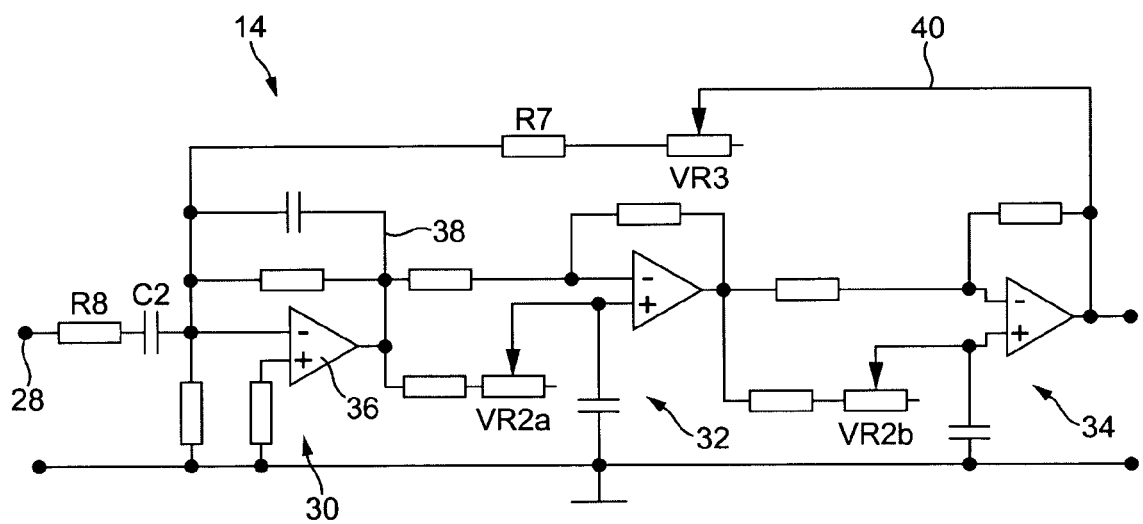
FIG. 6 is a circuit diagram of a first feedback filter arrangement for use in the sensor system of FIG. 4 or 5.

In the filter 14 of FIG. 6, each of the second and third stages 32, 34 is controlled, by means of a respective potentiometer VR2a and VR2b, to display unity gain at all frequencies within the operating range of the sensor 12 (at least two decades in frequency) and an adjustable phase shift. The amplifier 36 of the first stage 30 drives the all-pass filters 32, 34 and is arranged to receive from the output of the all-pass filters 32, 34, by way of a feedback loop 40 including a potentiometer VR3 and a resistor R7, a feedback signal, which is then summed with the signal received at an input 28 of the filter 14 and supplied to the first stage amplifier 36 by way of a further resistor R8 and capacitor C2. This sum becomes zero when there is precisely 180° of phase shift across the all-pass filters 32, 34. At the frequency where this condition is satisfied, the overall gain of the filter circuit 14 tends to the open loop gain of the amplifier 36 of the first stage 30. For all other frequencies, the gain tends to unity. The level of overall feedback in the loop 40 provided by the filter 14 is adjusted by varying the contribution from the all-pass filters 32, 34, using the potentiometer VR3.

The level of overall feedback provided by the filter 14 may also be related proportionally to the quality or Q factor of the filter 14, so that adjustment of the level of overall feedback will adjust the Q factor accordingly. The overall feedback controlled by the potentiometer VR3 at the centre frequency of the filter 14 (as set by the potentiometers VR2) determines the level of frequency multiplication, which occurs in the filter 14, and hence its Q factor. The ability to control the Q factor of the filter 14 in this way enables the Q factor to be set to a desired level, appropriate for the characteristics of the particular signal to be detected (i.e. the frequency stability of the signal). In addition, this allows the Q factor to be reduced temporarily when the filter is re-tuned to a different frequency and then to be returned to the preset value, which speeds up the settling time of the filter 14.

The filter 14 of FIG. 4 or 5 may also be implemented using switched capacitor techniques in order to achieve a tunable filter, in which the frequency may be varied. This is possible, for example, by employing a clock signal of variable frequency to control a capacitor arrangement. The sensor 12 may then be tuned in a manner analogous to a radio receiver.

Figure 7:
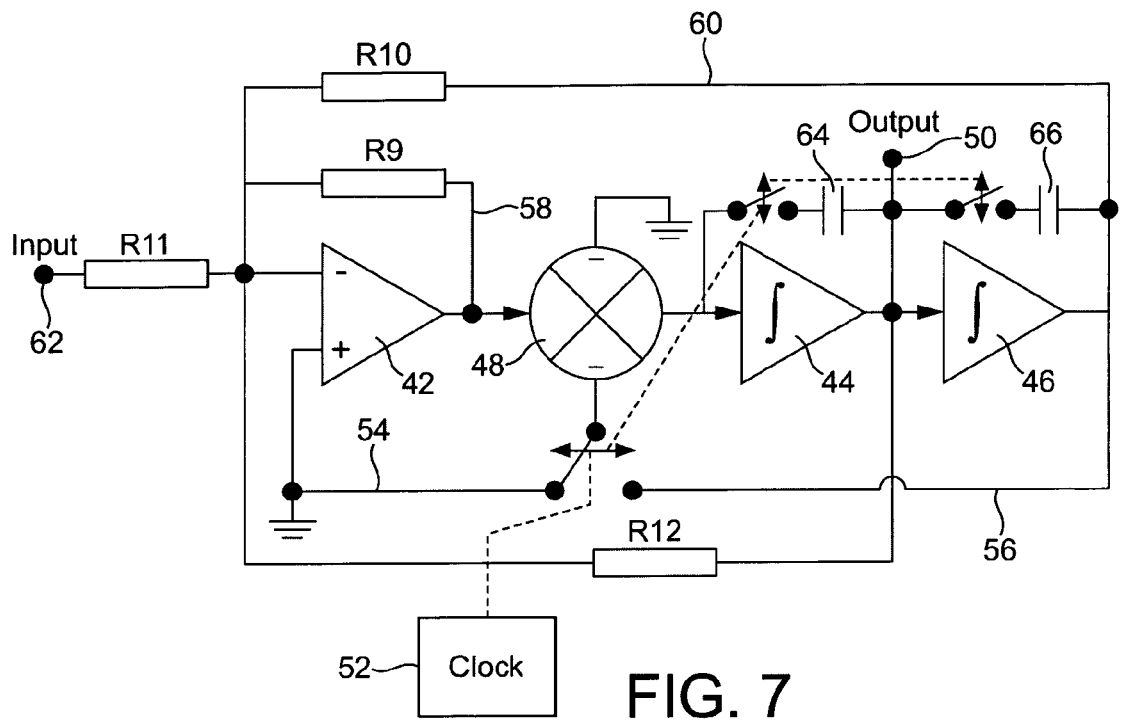
FIG. 7 is a circuit diagram of a second feedback filter arrangement for use in the sensor system of FIG. 4 or 5.

Such an arrangement is shown in FIG. 7, in which the band-pass filter 14 has been configured, using an industry standard switched capacitor filter building block, to provide a universal state variable second order active filter, which is capable of a variety of functions with the ability to implement Butterworth, Chebyshev, Bessel and Cauer configurations. The transfer function of the filter 14 is realized using a combination of first and second stage integrators 44, 46 arranged in series, as shown, to receive the output from the amplifier 42 by way of a summer 48. This results in low pass, high pass, band-pass and band-stop functions all being available simultaneously from different parts of the circuit, according to the location of the output 50 of the filter 14. For a band-pass function, the output of the filter 14 is taken from the output of the first stage integrator 44.

In the circuit of FIG. 7, a clock 52 operates a switching function indicated by the arrow $f_{clk}$, for controlling two feedback loops 54, 56, respectively, from the summer 48 to the non-inverting input of the amplifier 42, or from the output of the second stage integrator 46 to the input of the first stage integrator 44 by way of the summer 48; and also for controlling switched capacitors 64, 66 associated respectively with the integrators 44, 46. The centre frequency $f_o$ of the filter 14 is adjusted by varying the clock frequency, which then varies the frequency of the switching function denoted by the arrow $f_{clk}$ and also of the switched capacitors 64, 66 associated with the two integrators 44, 46, which set the time constants for these and hence the operating frequency. Further feedback to the inverting input of the amplifier 40 is supplied from its output by way of a feedback loop 58 including a resistor R9, and from the output of the second stage integrator 46 by way of a feedback loop 60 including a resistor R10. The clock frequency, together with the values of R9 and R10, determines the centre frequency $f_o$ of the filter 14, as follows:

$$f_0 = \frac{f_{clk}}{100}\sqrt{\left(\frac{R9}{R10}+1\right)}$$

The gain $A_v$ of the filter 14 is determined by the ratio of the values of an input resistor R11 between its input 62 and the amplifier 42 and a feedback resistor R12 between the filter output 50 and the amplifier 42; and the Q factor is determined by a combination of the values of all four resistors;

$$A_v = -\frac{R12}{R11} \quad Q = \frac{\sqrt{R12/R10+1}}{R9/R12}$$

Hence, the Q factor may be controlled by replacing one or more of the relevant resistors by a digitally addressable potentiometer.

In order to acquire the sensor signal in practice, a frequency search may be carried out by scanning, using the variable frequency clock signal, first to identify the largest amplitude interference and then to reject it. The same facility may also be used to track changes in the frequency of a known signal or of interference, or to scan for a signal of unknown frequency.

Figure 8:
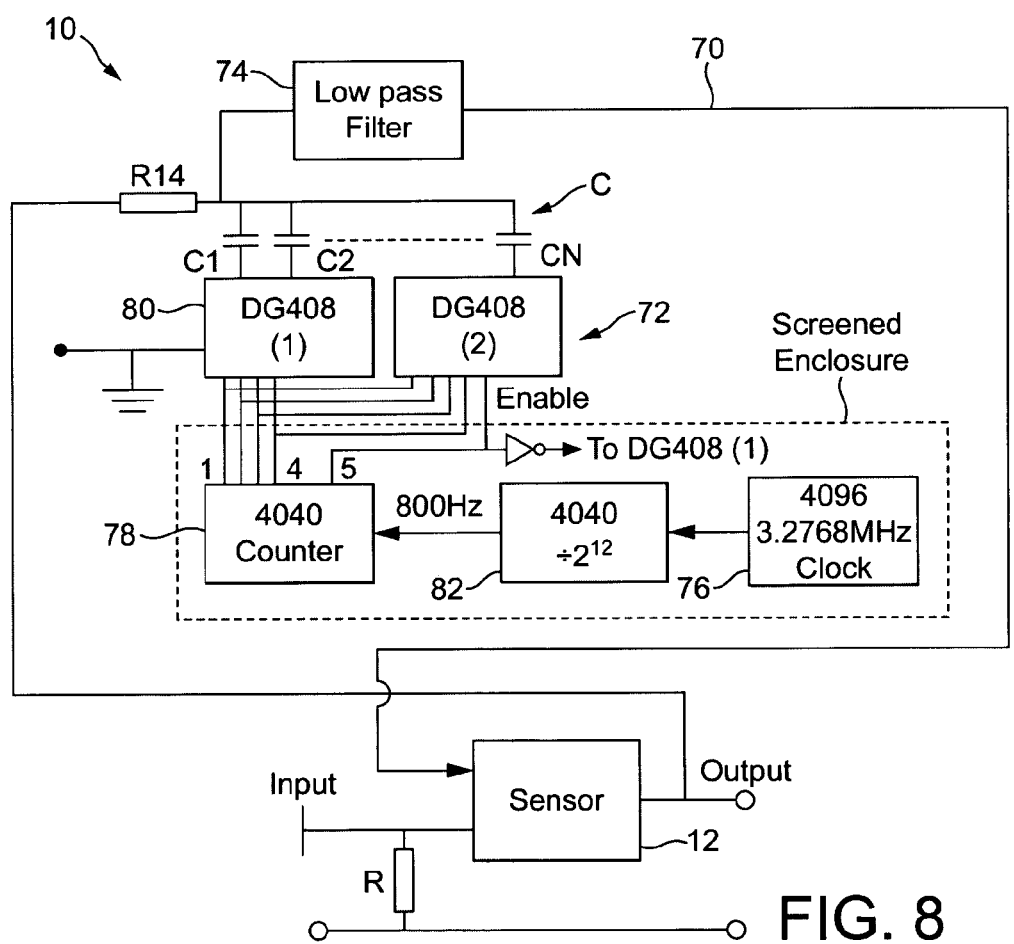
FIG. 8 is a circuit diagram of a sensor system having a feedback arrangement including a comb filter.

The arrangements of FIGS. 4 to 7 all employ a fixed or tunable filter arrangement for filtering out interference of a single frequency. It is also possible to reject multiple frequencies if a comb filter with a band-pass response is used in the feedback loop, and a sensor system 10 employing such an arrangement is shown in FIG. 8. Here, as shown, the sensor 12 has a feedback loop 70 including a resistor R14, a comb filter 72 and a low pass filter 74. The comb filter 72 uses switched capacitor techniques selectively to filter a frequency and the related harmonics, the comb filter 72 comprising a bank C of parallel capacitors $C_1$ to $C_N$ controlled by way of a clock circuit 76 and counter 78 through switching elements 80. The bank of capacitors $C_1$ to $C_N$ is switched or commutated at a clock frequency much higher than the signal frequency.

In this example, the switching elements 80, shown labelled DG408, are multiplexing switching circuits, which are digitally addressable. The clock signal, in this example, is derived from a stable crystal controlled master oscillator running at a frequency of 3.2768 MHz to provide the clock 76. The clock output is then divided down using a first 4040 counter 82 to 800 Hz. The 800 Hz signal drives another 4040 counter, providing the counter 78, configured to provide the digital addressing for the DG408 switches.

When the capacitors $C_1$ to $C_N$ are switched at a frequency $Nf_o$ (where N is the number of capacitors) this will synchronise with input signals at frequencies of $nf_o$, where n is an integer. Thus, a set of band-pass peaks may be observed across the capacitor bank C. The output from the capacitor bank C requires low pass filtering to remove the switching noise, and is therefore supplied to the sensor 12 by way of the low pass filter 74.

This arrangement is particularly useful when dealing with mains related noise, which frequently contains many harmonics. Comb filters also have the ability to track changes in the fundamental frequency of a signal by varying the clock frequency as already described in relation to FIG. 7.

It should be noted that if a comb filter configured as a band-stop filter were placed at the output of a sensor in a conventional manner, it would achieve some improvement in the dynamic range and signal to noise ratio. However, such a configuration will always be inferior to the arrangement according to the invention, by which the comb filter is incorporated within the sensor feedback loop and therefore rejects the unwanted signal at the input of the sensor.

Figure 9:
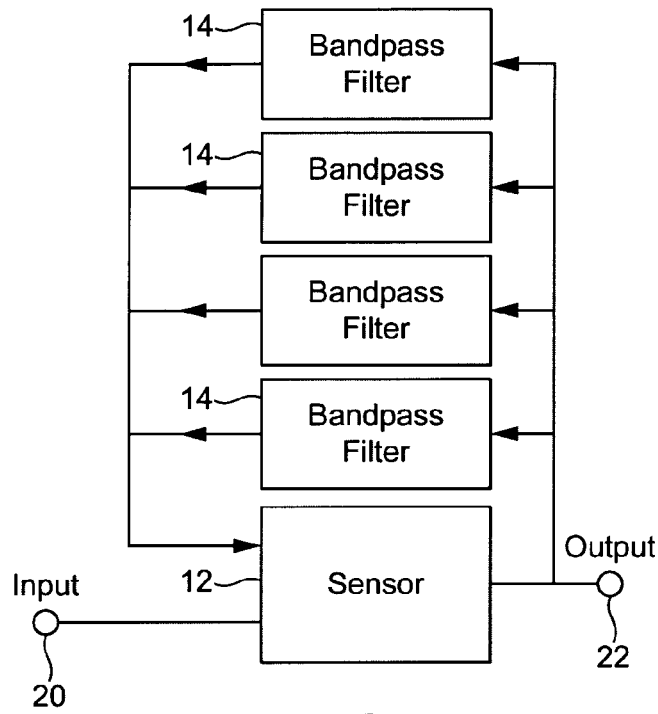
FIG. 9 is a block diagram of a second embodiment of sensor system according to the invention, similar to that of FIG. 4 but employing a plurality of band-pass filters arranged in parallel in the feedback arrangement.

Another circuit arrangement in which multiple frequencies may be rejected employs a plurality of the band-pass filters 14 arranged in parallel in the feedback loop of the sensor 12, as shown in FIG. 9. Such individual band-pass filters may be constructed as shown in any of FIGS. 6 to 8. This creates the option of rejecting frequencies that are not simple harmonics. Hence, this arrangement can be used to reject interference signals from more than one source, which interference signals are not related in frequency or phase.

Figure 10:
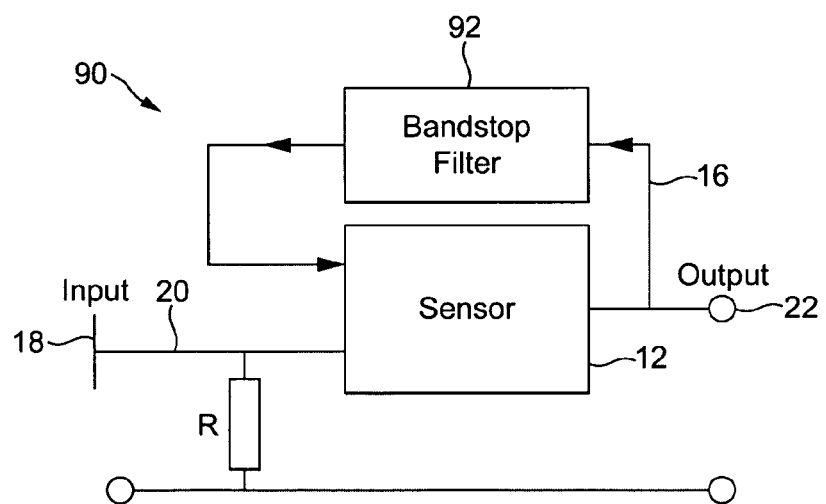
FIG. 10 is a basic block diagram of a third embodiment of sensor system according to the invention, similar to that of FIG. 4 but employing a band-stop filter in the feedback arrangement.

Another possibility according to the invention is to employ a filter designed to perform a band-stop or notch function, instead of a band-pass function. In this instance, the sensor 12 will behave as a tuned single frequency sensor, which will reject all other frequencies. Such a sensor system 90 is shown in FIG. 10, and comprises a sensor 12 having an input 20 arranged to receive an input signal from an input electrode 18 and an output 22 for supplying an output signal, as before. Also, as before, the sensor 12 has a feedback loop 16, but in this instance the filter 14 in the feedback loop is replaced by a band-stop filter 92.

The sensor system of FIG. 10 has applications where the signal to be detected is of known frequency and the background noise is not well defined in frequency, ie the sensor 92 has a narrow band, tuned band-pass characteristic.

Figure 11:
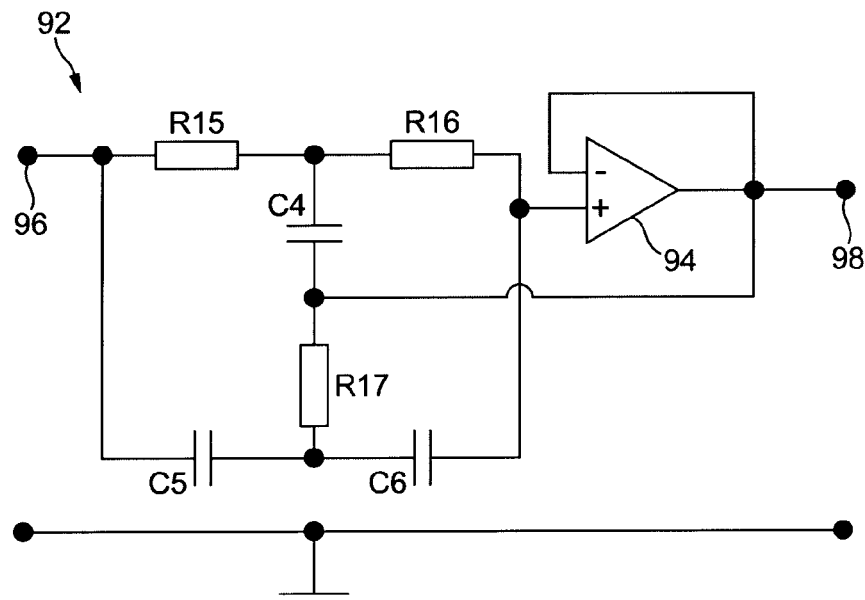
FIG. 11 is a circuit diagram of a first feedback filter arrangement according to the third embodiment.

An example of a simple notch filter 92 is shown in FIG. 11. Here, the filter 92 comprises an operational amplifier 94 and has an input 96 and an output 98. Two resistors R15, R16 and a capacitor C4 form a low pass filter network, while two capacitors C5, C6 and a resistor R17 form a high pass filter network at the same frequency, between the input 96 and the amplifier 94. Together, the two filter networks form a twin T network capable of providing a single frequency notch, if the following conditions are satisfied:

$$f_0 = \frac{1}{2\pi R15 C4} \quad R15 = R16 = 2 \times R17 \quad C4 = C5 = \frac{C6}{2}$$

The amplifier 94 is configured as a unity gain buffer, by applying 100% negative feedback via the inverting input, to prevent the filter circuit from being loaded by subsequent stages to which it may be connected.

If the frequency of the filter 92 is in addition made variable, the sensor 90 may be tuned in a manner analogous to a radio receiver, in order to acquire the signal. This facility may also be used to track changes in frequency of a known signal, or scan for a signal of unknown frequency, as before.

Figure 12:
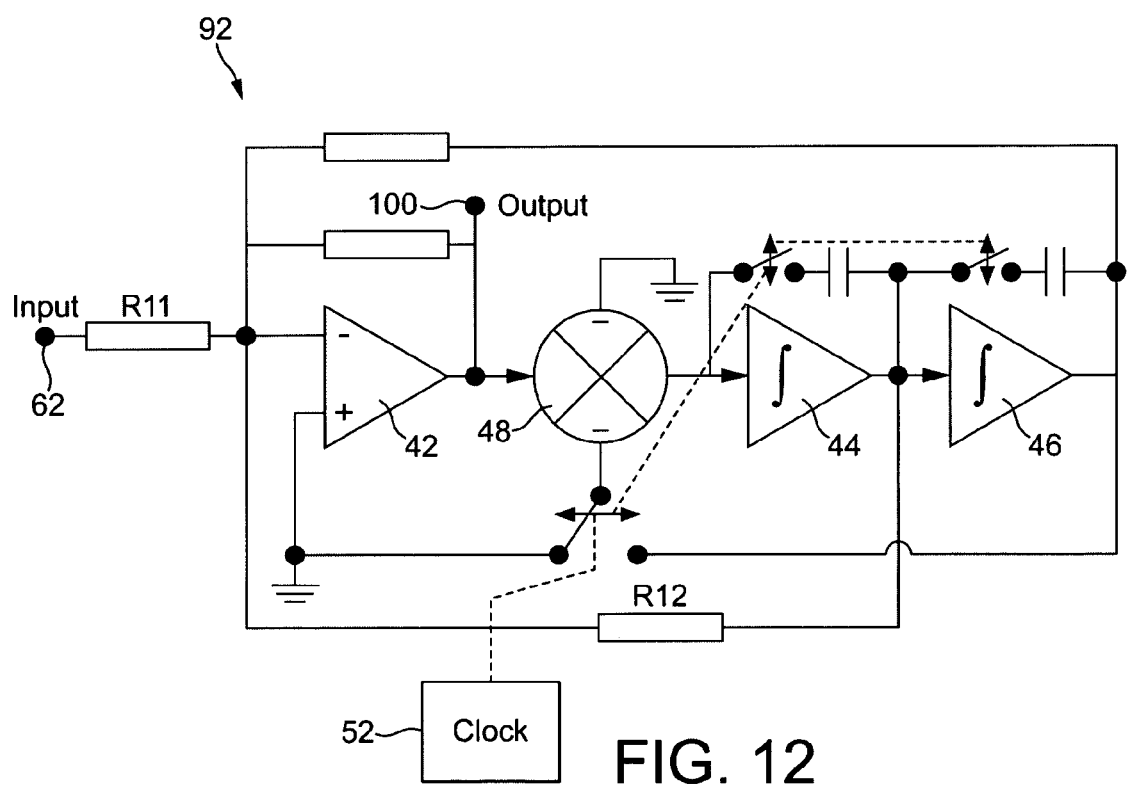
FIG. 12 is a circuit diagram of a second feedback filter arrangement according to the third embodiment.

FIG. 12 shows a switched capacitor implementation of a band-stop filter 92 analogous to the band-pass filter of FIG. 7. The filter 92 of FIG. 12 uses the same universal state variable second order active filter as the band-pass filter of FIG. 7, and accordingly the same parts are identified by the same reference numerals. The filter input 62 is located as previously; the difference in the present instance is merely that the location of the filter output has been moved. The band-stop output 100 is now taken from the output of the amplifier 42 instead of from the output of the first integrator 44 as was the case for the band-pass filter shown in FIG. 7.

In the present instance, the centre frequency and the Q factor are set and adjusted in the same way as for the filter of FIG. 7, but since the output 100 is taken from a different location, the gain $A_v$ of the filter 92 is set using a different combination of resistors, as follows:

$$A_v = -\frac{R11}{R12}$$

Figure 13:
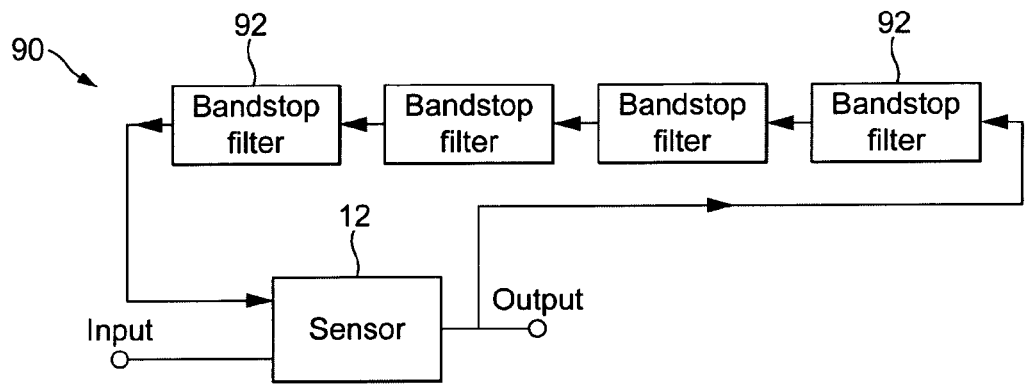
FIG. 13 is a block diagram of a fourth embodiment of sensor system according to the invention, similar to that of FIG. 10 but employing a plurality of band-stop filters arranged in series in the feedback arrangement.

Turning to FIG. 13, if a number of band-stop filters 92 are used in series to provide multiple feedback paths, then a set of band-pass functions will be implemented and the sensor system 90 will respond to the fundamental and harmonics, rejecting all other signals. This will find application where a particular waveform (shape), such as a periodic pulse, is to be detected. A pulse consists of a fundamental plus related harmonics as may be shown by Fourier analysis. Using a combination of such filters 92 will allow the sensor system 90 to respond only to a particular shape of waveform.

Figure 14:
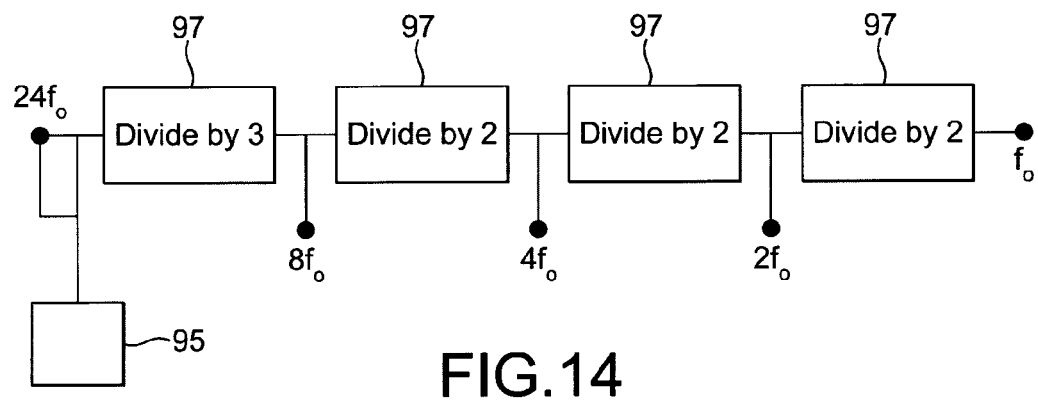
FIG. 14 shows a variation on the embodiment of FIG. 13.

The filters 92 may also be constructed using switched capacitor techniques, or a comb filter, as previously described, and so may be digitally clocked to select the frequency of operation. Alternatively, the filters 92 may be clocked using harmonically related signals, which are derived from a common source 94 and are divided down using one or more frequency counters 96, as shown in FIG. 14, to adjust the pass bands of the sensor 12. The circuit shown in this Figure uses a digital clock signal from the source 94 at 24 times the fundamental frequency of the desired signal to generate the fundamental ($f_0$) and low order harmonics by a process of frequency division using one divide by 3 and three divide by two frequency counters 96. The exact configuration of dividers will depend on the harmonics required, but in the example shown it is possible to produce the first four even harmonics ($f_0$, $2f_0$, $4f_0$, $8f_0$). The input clock signal may be derived either from a stable fixed frequency oscillator, such as a quartz crystal based circuit, or from a variable frequency oscillator. In the latter instance, the frequency of the variable oscillator may be adjusted either by trimming changing component values or may be derived from or synchronised by a control computer.

The arrangement of FIG. 14 enables the set of harmonics to be moved in unison, such that a particular mixture of harmonics may be preserved even when the frequency of the filters 92 is changed. This gives the sensor the capability to search for a particular mix of harmonics (or shape of waveform) as a function of frequency. In addition, the performance of the system may be enhanced further by selecting the effective Q factor of the band-pass filters (i.e. bandwidth of each spike) as already described, which again may be achieved digitally using a digital potentiometer to set the Q of each filter in the feedback network.

Figure 15:
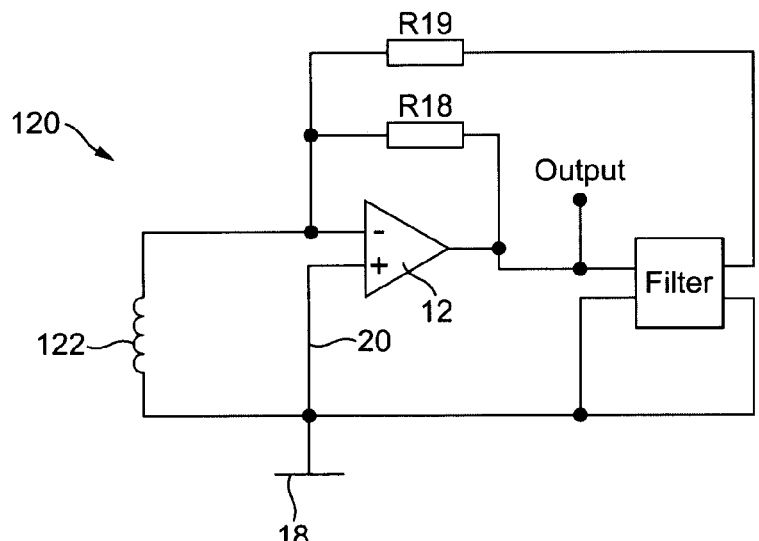
FIG. 15 is a circuit diagram of an induction magnetometer according to the first embodiment.

An induction magnetometer 120 according to the first embodiment of FIG. 4 will now be described with reference to FIG. 15. According to this embodiment, the sensor system includes the operational amplifier 12 providing the sensor as before, the amplifier being arranged to receive an input signal from a search coil 122 by way of the input 20 and being configured as a current to voltage converter circuit using a feedback resistor R18.

In use, a current I is induced in the search coil 122 by a magnetic field B, the current I being given by:

$$I = \frac{B \cdot A}{L}$$

where A is the cross-sectional area of the search coil and L is the coil inductance.

Such current I generates an input current $I_{in}$ to the amplifier 12, whose output voltage $V_{out}$, based on the amplifier 12 being configures as a simple current to voltage converter, is given by:

$$V_{out} = I_{in} \cdot R18$$

Current from the search coil 122 is thus supplied to the amplifier 12 to be amplified, and the output from the sensor 12 is supplied to the filter 14, as before. Another feedback resistor R19 sums the filter output with the feedback signal from the resistor R18. The combination of current to voltage converter and the search coil 122 forms an induction magnetometer system 120 capable of extremely high sensitivity. The high degree of sensitivity causes problems in operation with a commensurately high dynamic range requirement, if the device is to operate in an open unshielded environment.

The simplest implementation in this application is to use a band-pass filter 14 tuned to the fundamental frequency of the mains electricity supply (50 Hz or 60 Hz), as shown in FIG. 6. This interference is typically many times larger in amplitude than the signal of interest and frequently drives a conventional magnetometer into saturation, preventing data acquisition. Use of the present feedback filter techniques typically reduces the amplitude of the fundamental component of the interference by up to 60 dB. This is equivalent to a 60 dB increase in the dynamic range of the sensor for many applications.

Tunable filters, such as that shown in FIG. 7 may also be used in the case of an induction magnetometer, as already described.

Various embodiments and examples of the present invention have been described with reference to the accompanying drawings, but it will be appreciated that further variations and modifications are still possible within the scope of the invention.

For example, although all of the described embodiments specify a filter arrangement provided in a negative feedback path, it would also be possible to situate the filter arrangement in a positive feedback path, for example as a part of a bootstrapping circuit as described with reference to FIG. 5 or as a part of one or more other ancillary circuits of the kind described in our earlier case WO 03/048789, since it is also possible to influence the frequency response of the sensor by incorporating filters into positive feedback (eg bootstrap, guard or neutralisation) circuits. In all these instances, the frequency response may be manipulated in the same way as for the negative feedback filter arrangements, although the enhancement/suppression capability will now be limited by the extent to which the bootstrap/guard/neutralisation circuit is able to enhance the input signal.

In the case of the present FIG. 5 embodiment, where bootstrapping is used to increase the input resistance of the sensor, providing the filter arrangement in the bootstrapping circuit would be most effective for low frequency applications where the input capacitance is not a limiting factor. It is still possible to create a frequency dependent input resistance either using a notch or bandpass filter configuration, although as indicated the improvement will be limited to the increase obtained using a conventional (i.e. not frequency dependent) bootstrapping arrangement.

By using an active guard amplifier with both adjustable gain and a frequency dependent filter characteristic, the frequency response may also be manipulated in the same way as for the described negative feedback filter arrangements. As indicated, the enhancement/suppression capability is limited by the extent to which the guard circuit is able to enhance the signal. For example, if the guard circuit is providing a 20 dB increase in signal then only 20 dB of reduction in unwanted signal may be achieved using a notch filter. Similarly, an enhancement of only 20 dB would be the limit for a bandpass filter in this case. The guard circuit operates by eliminating stray capacitance by raising the potential of a conducting shield to be the same as the input (measurement) electrode, which is equivalent to raising the input impedance of the sensor. Therefore, by adding a filter circuit into the guard circuit, a frequency dependent input impedance is created.

Neutralisation may be considered to be a limiting case of guarding where the intrinsic input capacitance of the sensor is neutralised directly by applying a positive feedback signal through a capacitor to the input. This is in contrast to guarding, where the input is shielded from stray capacitance by a guarded shield, the capacitance of which is neutralised by the guard signal.

Accordingly, the present invention provides a highly versatile and sensitive sensor system in which the sensor may be tuned closely to the precise signal environment in which it is being used. By tailoring the response of the sensor through the use of tuned or tunable narrow band filter arrangements, interference can effectively be overcome and a very precise signal measurement can be achieved. Such a sensor system may find application in a wide variety of applications.

The invention claimed is:

1. A high impedance electric potential sensor comprising:
    a detection electrode for detecting electrical potentials from an object under test and for generating electrical detection signals, an amplifier connected to the detection electrode for receiving the electrical detection signals from the detection electrode and for producing an amplified measurement signal as output;
    the amplifier having at least one ancillary circuit providing a positive feedback arrangement for enhancing sensitivity of the electric potential sensor to detected electrical potentials, the at least one ancillary circuit including a bootstrapping circuit for providing bootstrapping to an input bias resistor for the amplifier; and
    a negative feedback arrangement for the amplifier to control sensitivity of the electric potential sensor to signals of differing frequency in order to tailor a frequency response of the electric potential sensor, the negative feedback arrangement comprising an active narrow band filter situated in a negative feedback path from the output to the input of the amplifier, and tuning circuitry for tuning the filter to a selected frequency or selected frequencies, whereby to tune the frequency response of the electric potential sensor with respect to at least one of the detection signals generated by an object under test and unwanted signals representing interference so as to increase an amplitude of the detection signals relative to an amplitude of unwanted interference signals whereby to increase an effective dynamic range of the electric potential sensor.

2. A sensor according to claim 1, wherein the feedback arrangement is arranged to increase the amplitude of the detection signals.

3. A sensor according to claim 1, wherein the feedback arrangement is arranged to attenuate unwanted interference signals.

4. A sensor according to claim 1, comprising means for controlling a Q factor of the filter to adjust the selectivity of the electric potential sensor.

5. A sensor according to claim 1, wherein the filter is a band-pass filter.

6. A sensor according to claim 5, comprising a plurality of the band-pass filters arranged in parallel in the feedback path.

7. A sensor according to claim 1, wherein the filter is a band-stop filter.

8. A sensor according to claim 7, comprising a plurality of the band-stop filters arranged in series in the feedback path.

9. A sensor according to claim 5, wherein the band-pass filter comprises a first filter stage including an amplifier, and at least one successive filter stage comprising an all-pass filter, and wherein the output of the at least one successive filter stage is fed back to a summing junction at an input of the first filter stage such that a signal at the input becomes zero when a phase shift of 180° occurs across the at least one successive filter stage.

10. A sensor according to claim 1, wherein the filter comprises a comb filter.

11. A sensor according to claim 1, wherein the filter comprises a tunable filter implemented using a switched capacitor.

12. A sensor according to claim 7, wherein the filter comprises a second order active filter.

13. A sensor according to claim 7, wherein the filter comprises an amplifier, and at least one integrator arranged to receive an output of the amplifier by way of a summer.

14. A method of sensing and measuring electrical signals employing a high impedance electric potential sensor having a detection electrode for detecting electrical potentials from an object under test, and an amplifier connected to the detection electrode, the method comprising:
    detecting electrical potentials at the detection electrode and generating electrical detection signals;
    applying the detection signals to an input of the amplifier for producing an amplified measurement signal as output;

enhancing sensitivity of the electric potential sensor to detected electrical potentials by means of a positive feedback arrangement comprising at least one ancillary circuit, the at least one ancillary circuit including a bootstrapping circuit for providing bootstrapping to an input bias resistor for the amplifier;

controlling sensitivity of the electric potential sensor to signals of differing frequency in order to tailor a frequency response of the electric potential sensor by means of negative feedback arrangement comprising an active narrow band filter situated in a negative feedback path from an output of the electric potential sensor to the input; and tuning the filter to at least one selected frequency, whereby the frequency response of the filter is controlled to tune the frequency response of the electric potential sensor with respect to at least one of the wanted detection signals generated by an object under test and unwanted signals representing interference signals so as to increase an amplitude of the wanted detection signals relative to an amplitude of unwanted interference signals whereby to increase an effective dynamic range of an electric potential sensor.

15. A method according to claim 14, comprising increasing an amplitude of wanted detection signals.

16. A method according to claim 14, comprising attenuating the interference signals.

17. A method according to claim 14, comprising controlling a Q factor of the filter to adjust the selectivity of the electric potential sensor.

18. A method according to claim 14, comprising tuning the filter using switched capacitor techniques.

* * * * *